United States Patent

Choi

[11] Patent Number: 6,154,073
[45] Date of Patent: Nov. 28, 2000

[54] DELAY LOCKED LOOP DEVICE OF THE SEMICONDUCTOR CIRCUIT

[75] Inventor: Jae Myoung Choi, Kyoungki-do, Rep. of Korea

[73] Assignee: Hyundai Electronics Industries Co., Ltd., Ichon-shi, Rep. of Korea

[21] Appl. No.: 09/196,121

[22] Filed: Nov. 20, 1998

[30] Foreign Application Priority Data

Nov. 21, 1997 [KR] Rep. of Korea ....................... 97-62077

[51] Int. Cl.[7] ....................................................... H03L 7/00

[52] U.S. Cl. .......................... 327/161; 327/157; 327/284; 331/25; 375/373

[58] Field of Search ..................................... 327/141, 144, 327/146, 147–150, 151, 152, 153, 155, 161–162, 261, 269, 271, 276, 277, 284; 331/12, 25; 375/373–376

[56] References Cited

U.S. PATENT DOCUMENTS

| | | | |
|---|---|---|---|
| 4,704,574 | 11/1987 | Nossen | 324/76.82 |
| 5,295,164 | 3/1994 | Yamamura | 375/376 |
| 5,345,119 | 9/1994 | Khoury | 327/553 |
| 5,771,264 | 6/1998 | Lane | 375/376 |
| 5,854,797 | 12/1998 | Schwartz et al. | 714/724 |
| 5,963,069 | 10/1999 | Jefferson et al. | 327/158 |

*Primary Examiner*—Timothy P. Callahan
*Assistant Examiner*—Minh Nguyen
*Attorney, Agent, or Firm*—Jacobson, Price, Holman & Stern, PLLC

[57] ABSTRACT

Delay Locked Loop device generates an internal clock by receiving an external clock. Multiplexer is provided to receive N delay signals outputted from the first to Nth delay elements which receives the external clock. The Delay Locked Loop device generates the internal clock by selecting one of the N delay signals. The phase of the internal clock follows the phase of the external clock.

6 Claims, 2 Drawing Sheets

DELAY LOCKED LOOP DEVICE OF THE SEMICONDUCTOR CIRCUIT

BACKGROUND OF THE INVENTION

1. Field of the Invention

The present invention relates to a clock compensation device of the semiconductor circuit, and more particularly, to a Delay Locked Loop device which is type of the clock compensation devices generating an internal clock by receiving an external clock.

2. Description of the Prior Art

Delay Locked Loop device generates an internal clock by receiving an external clock. It is utilized to match the frequency and the phase of the external clock and the internal clock.

In general, Delay Locked Loop device includes a phase detector, a charge pump and a delay means. The phase detector compares and detects the difference of frequency or the difference of the phase of the external clock and the internal clock. The charge pump which receives the output signal from the phase detector and outputs the pumping signal controls the delay time of the delay means by controlling delay elements in the delay means. The delay means is controlled by the output signal from the charge pump and outputs the internal clock by receiving the output clock.

FIG. 1 is a block diagram of a Delay Locked Loop device of a prior art. Delay Locked Loop device in FIG. 1 further includes a filter to eliminate noises in the output signal from the charge pump.

FIG. 2 is a detailed circuit of a delay means in FIG. 1. The delay means includes a plurality of delay elements. As described above, the delay means generates an internal clock by receiving an external clock. The phase difference and the frequency difference between the internal and external clock are controlled by the pump voltage Vpump from the charge pump.

In other words, when an external clock is inputted, the delay means generates a certain internal clock when the pump voltage Vpump maintains an arbitrary voltage level.

Thereafter, the phase detector compares and detects the frequency and/or phase of the external and internal clock.

If the frequencies and/or phases of the two clocks matchs, charge pump maintains the initial pump voltage Vpump and the phase detector outputs no signal.

However, if the frequencies and/or phases of the two clocks does not match, the phase detector generates an output signal to control charge pump. Then, the charge pump outputs a controlled pump voltage Vpump. The voltage level of the controlled pump voltage Vpump increases or decreases in accordance with the state of the output signal from the phase detector.

For example, if the phase of the internal clock outputted from the delay means lags more than the phase of the external clock, the phase detector outputs high voltage level to raise the level of the pump voltage Vpump from the charge pump to compensate the lag in the internal clock.

The increase in pump voltage Vpump is inputted to the bias transistors of the delay elements, which consist of CMOS transistors, to shorten the delay time. Accordingly, the lag phase of the internal clock is compensated. If the phase of the internal clock is faster, then the phase detector compares the difference of two phases and outputs low voltage level to decrease the level of the pump voltage Vpump from the charge pump to compensate the faster phase of the internal clock.

Accordingly, if such a control process for the phase continues repeatedly, the Delay Locked Loop device arrives at the Lock state.

Wherein, the Lock state indicates that the frequencies and/or phases of the external clock and internal clock match.

As illustrated above, the Delay Locked Loop device controls the delay time by controlling the bias transistors in the delay elements.

However, the pump voltage level changes slowly because the output signal from the charge pump is an analog signal. For this reason, the delay time of the Delay Locked Loop device also changes slowly. Accordingly, very long Lock time is required in order to match frequencies and/or phases between the external clock and internal clock. In addition, there is a problem wherein, the frequency bandwidth of the Delay Locked Loop device in a prior art is confined to certain range because the entire delay time of the delay means is fixed.

Therefore, it is an object of the invention to provide a Delay Locked Loop device which improves the locking time and extends the operating frequency bandwidth.

Another object of the invention is to provide a Delay Locked Loop device which includes a plurality of the delay elements each of which outputs different delay times.

Still, another object of the invention is to provide a Delay Locked Loop device which includes a phase detector for detecting the phase difference, and includes counter for selecting one of the output signals from the delay elements.

SUMMARY OF THE INVENTION

Accordingly, the present invention is directed to a Delay Locked Loop device which is one of the clock compensation devices generating an internal clock by receiving an external clock.

Delay Locked Loop device that is one embodiment of the present invention comprises, delay means for receiving an external clock and generating an internal clock, said delay means having a first to Nth delay elements delaying the received external clock in order to match the phase of the external clock with the phase of the internal clock; phase detector for outputting detect signal which discriminates differences between the phase of the external clock and the phase of the external clock; counter for receiving the detect signal from the phase detector, outputting a first control signal to control the phase of the internal clock generated from the delay means, and outputting a second control signal to contol the delay range of the delay means when the difference between the phase of the external clock and the phase of the internal clock exceeds the delay range of the delay means; and charge pump for receiving the second control signal outputted from the counter, and generating pump voltage which controls the delay means in order to make the difference between the phase of the external clock and phase of the internal clock exist within the delay range of the first to Nth delay means.

The frequency of the external clock is identical with the frequency of the internal clock. The internal clock outputted from the delay means is an output signal from one of the first to Nth delay elements selected by the first control signal generated from the counter.

The embodiment of the invention further comprises a filter for outputting noiseless pump voltage by receiving the pump voltage from the charge pump.

The delay means of the invention comprises a multiplexer for receiving N delay signals outputted from each of the first to Nth delay elements and outputting one of the N delay signals as the internal clock in accordance with the first control signal from the counter.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description serve to explain the principles of the drawings:

DETAILED DESCRIPTION OF THE PREFERRED EMBODIMENTS

Figure 1:
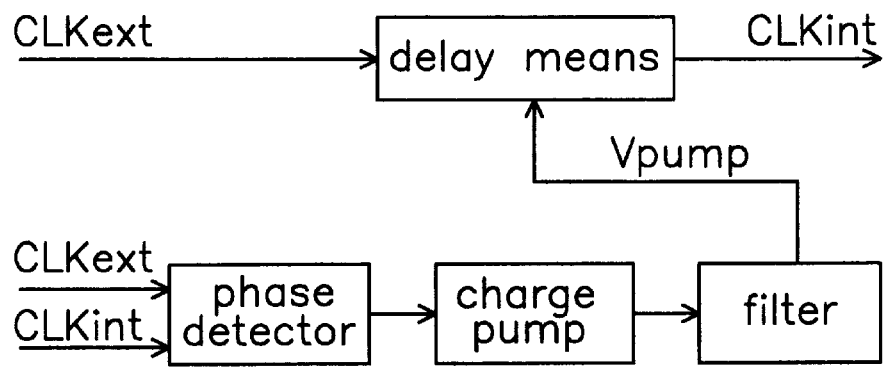
FIG. 1 is a block diagram of a Delay Locked Loop device of a prior art.
Figure 2:
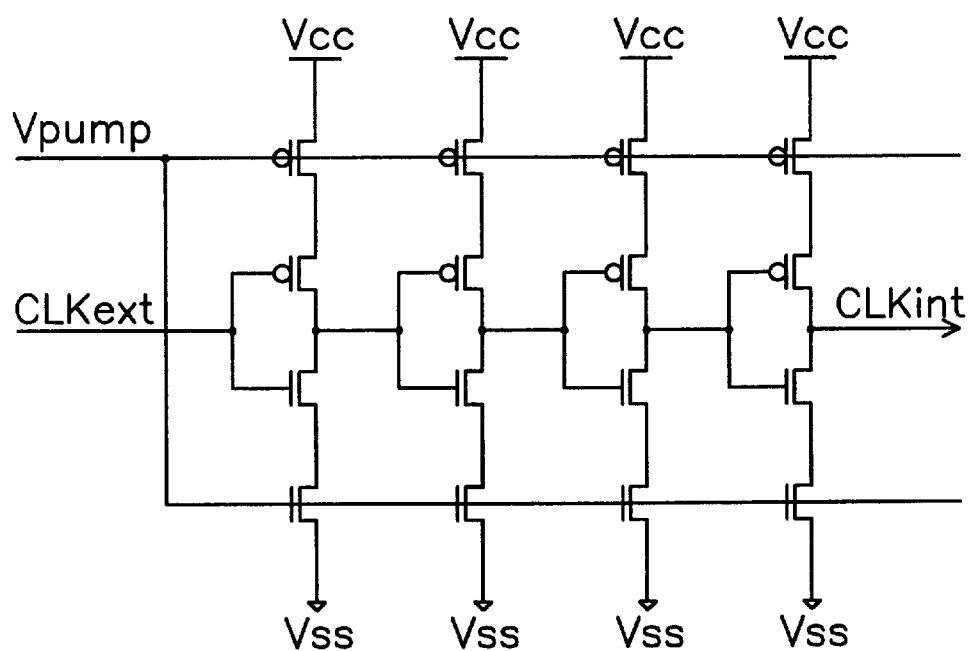
FIG. 2 is a detailed circuit of the delay means in prior art.
Figure 3:
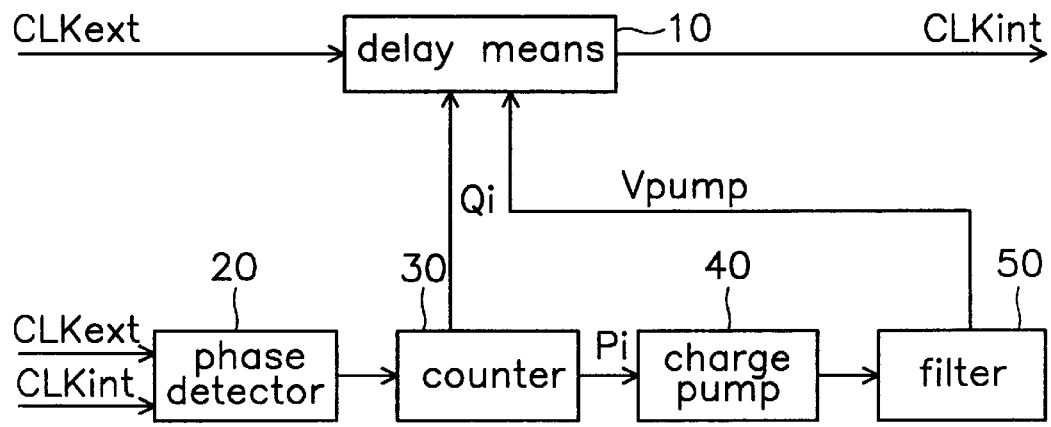
FIG. 3 is a block diagram of a Delay Locked Loop device of the present invention.

FIG. 3 is a block diagram of a Delay Locked Loop device of the present invention.

Delay means 10 receives a external clock CLKext and generates an internal clock CLKint. Delay means have a first to Nth delay elements for delaying the received external clock in order to match the phase of the external clock with the phase of the internal clock. It will be explained hereinafter with reference to FIG. 4.

Phase detector 20 outputs detecting signal which discriminates the phase difference between the phase of the internal clock and phase of the external clock. Counter 30 receives the detecting signal from the phase detector and outputs a first control signal Qi to control the phase of the internal clock generated from the delay means, and outputs a second control signal Pi to control the delay range of the delay means when the difference between the phase of the external clock and phase of the internal clock exceeds the delay range of the delay means.

Charge pump 40 receives the second control signal Pi outputted from the counter and generates pump voltage Vpump that controls the delay means which makes the difference between the phase of the external clock and the phase of the internal clock exist within the delay range of the first to Nth delay means.

In FIG. 3, the frequency of the external clock is identical with the frequency of the internal clock. The internal clock generated from the delay means is one of the output signals from the first to Nth delay elements by the control of the first control signal from the counter.

The Delay Locked Loop device further comprises a filter 50 for receiving the pump voltage outputted from the charge pump and generating a noiseless pump voltage by eliminating the noise in the pump voltage.

Figure 4:
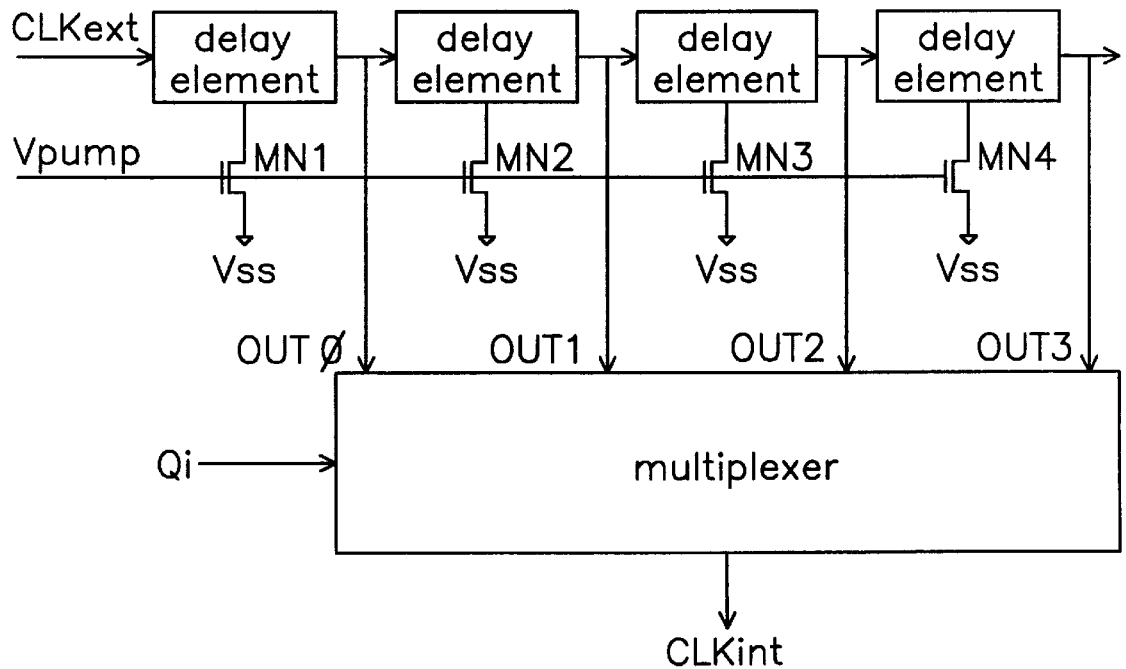
FIG. 4 is a detailed circuit of the delay means in the present invention.

FIG. 4 is a detailed circuit of the delay means in FIG. 3. As shown in FIG. 4, delay means includes a plurality of delay elements 11, 12, 13 and 14 which generate internal clocks OUT0, OUT1, OUT3 and OUT4 (each of the delay times of the internal clocks is different); a plurality of N-type MOS transistors MN1, MN2, MN3 and MN4 which are controlled by the pump voltage Vpump inputted to each gate of the transistors to control the delay time of the delay elements; and multiplexer 15 for receiving a plurality of the internal clocks OUT0, OUT1, OUT3 and OUT4 and selecting one of the internal clocks OUT0, OUT1, OUT3 and OUT4 in response to the control signal outputted from the counter.

In this embodiment, four delay elements shown in FIG. 4 are only used as an example. Therefore, it is possible to provide additional delay elements in other embodiments.

Hereinafter, it will be explained the operation of the present embodiment with reference to FIGS. 3 and 4.

In the initial stages, pump voltage Vpump outputted from the charge pump 40 maintains an arbitrary voltage level. Sizes of the transistors constituting the delay elements also is determined when it is designed. For example, if the delay time is determined as 2 ns, delay time of the internal clock OUT0 which is the output signal from the first delay element is 2 ns; delay time of the internal clock OUT1 which is output signal from the second delay element is 4 ns; delay time of the internal clock OUT2 which is output signal from the third delay element is 6 ns; delay time of the internal clock OUT4 which is output signal from the fourth delay element is 8 ns.

Accordingly, if an external clock is inputted in to the delay means, the entire internal clock, which are generated from the first to fourth delay elements and have different delay times from each other (for example, 2 ns, 4 ns, 6 ns, 8 ns) are inputted to the multiplexer. Thereafter, one of the internal clocks is selected as the preferred internal clock by the multiplexer.

If, for example, the phase difference between the phase of the external clock and phase of the internal clock is 4 ns and the phase of the internal clock is faster than the phase of the external clock, delay time of the internal clock will be delayed by 4 ns. Accordingly, the phase of the internal clock will be matched with the phase of the external clock by selecting the clock OUT1 with the multiplexer.

The phase detector compares the phase of the external clock with the outputted internal clock and detects the phase difference. Thereafter, phase detector outputs detecting signal and inputs it into the counter. The counter outputs counting signals and applies it to the mutiplexer to compensate the phase difference in accordance with the detecting signal. Then, the internal clock OUT1 from the second delay elements is selected and outputted from the output terminal of the multiplexer.

Similarly, if the phase of the internal clock is faster than the phase of the external clock by 6 ns, the internal clock OUT2 will be selected to compensate the phase difference.

However, if the phase of the external clock is faster than the phase of the internal clock by 6 ns, the delay time of the internal clock is shortened to compensate the phase difference. Accordingly, the internal clock OUT0 of the first delay element is selected to compensate the phase difference.

In other words, in the present invention, the phase differences of the external and internal clock are compensated regardless of the status of the phase difference and the Delay Locked Loop device arrives at the LOCK state stable.

In addition, for example, if the phase difference between the two clocks is less than 2 ns or more than 8 ns, the phase detector detects this difference and outputs detecting signal to the counter. Thereafter, counter outputs a certain signal Pi and inputs it into the charge pump. The charge pump controls current driving characteristic of the transistors attached to the delay elements in accordance to the voltage level state of the signal Pi.

For example, if the phase difference is 1 ns, the pump voltage Vpump from the charge pump is raised. If the phase difference is 9 ns, the pump voltage Vpump from the charge pump is decreased. Accordingly, the delay difference between two clocks is automatically controlled and the operating frequency bandwidth also broadened.

Furthermore, locking time is shortened when the prior art is replaced with the Delay Locked Loop device of the present embodiment because a plurality of the internal clocks are provided to generate various predetermined delay times.

As explained above, the embodiment shortens the locking time and extends the operating frequency bandwidth for it generates at least two internal clocks in digital type to compensate the phase difference between the phases of the internal and the external clocks.

The present embodiment can be embodied into many types of systems that necessitate a match for the phases or the frequencies of any clocks.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A Delay Locked Loop device comprising:
    delay means for receiving an external clock and generating an internal clock, said delay means having a first to Nth delay elements delaying the received external clock in order to match the phase of the external clock with the phase of the internal clock;
    phase detector for outputting a detect signal discriminating the difference between the phase of the internal clock and phase of the external clock;
    counter for receiving the detect signal from the phase detector and outputting a first control signal and a second control signal, said first control signal controlling the phase of the internal clock generated from the delay means; and
    charge pump for generating a pump voltage having a desired voltage level in accordance with said second control signal, said pump voltage controlling said first to Nth delay elements of the delay means;
    wherein the frequency of the external clock is identical with the frequency of the internal clock, and the internal clock generated from the delay means is one of the output signal from the first to Nth delay elements in accordance with the first control signal from the counter.

2. The Delay Locked Loop device as set forth in claim 1, further comprising a filter for receiving the pump voltage outputted from the charge pump and generating a noiseless pump voltage by eliminating the noise in the pump voltage.

3. The Delay Locked Loop device as set forth in claim 1, wherein said delay means further comprising:
    a multiplexer for receiving simultaneously N delay signals outputted from each of the first to Nth delay elements and outputting one of the N delay signals as the internal clock in accordance with the first control signal from the counter.

4. A Delay Locked Loop device comprising:
    delay means for receiving an external clock and generating an internal clock, said delay means having a first to Nth delay elements delaying the received external clock in order to match the phase of the external clock with the phase of the internal clock;
    phase detector for outputting a detect signal discriminating the difference between the phase of the internal clock and phase of the external clock;
    counter for receiving the detect signal from the phase detector, outputting a first control signal to control the phase of the internal clock generated from the delay means, and outputting a second control signal to control the delay range of the delay means when the phase difference between the phase of the external clock and the phase of the internal clock exceeds the delay range of the delay means; and
    charge pump for receiving the second control signal outputted from the counter and generating pump voltage which controls the delay means, said charge pump enabling the phase difference between the phase of the external clock and phase of the internal clock to exist within the delay range of the first to Nth delay means,
    wherein the frequency of the external clock is identical with the frequency of the internal clock, and the internal clock generated from the delay means is one of the output signal from the first to Nth delay elements in response to the first control signal from the counter.

5. The Delay Locked Loop device as set forth in claim 4, further comprising a filter for receiving the pump voltage outputted from the charge pump and generating a noiseless pump voltage by eliminating the noise in the pump voltage.

6. The Delay Locked Loop device as set forth in claim 4, wherein said delay means further comprising:
    a multiplexer for receiving N delay signals outputted from each of the first to Nth delay elements and outputting one of the N delay signals as the internal clock in response to the first control signal from the counter.

* * * * *